United States Patent
Chen et al.

(10) Patent No.: US 9,348,186 B2
(45) Date of Patent: May 24, 2016

(54) LCD PANEL AND METHOD FOR FORMING THE SAME

(71) Applicant: SHENZHEN CHINA STAR OPTOELECTRONICS TECHNOLOGY CO., LTD., Guangming New Dist., Shenzhen, Guangdong (CN)

(72) Inventors: Chenghung Chen, Guangdong (CN); Chengming He, Guangdong (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 14/853,305

(22) Filed: Sep. 14, 2015

(65) Prior Publication Data

US 2016/0004133 A1 Jan. 7, 2016

Related U.S. Application Data

(60) Continuation of application No. 14/463,986, filed on Aug. 20, 2014, now Pat. No. 9,170,461, which is a division of application No. 13/000,924, filed as application No. PCT/CN2010/079558 on Dec. 8, 2010, now Pat. No. 8,860,917.

(30) Foreign Application Priority Data

Nov. 26, 2010 (CN) .......................... 2010 1 0564422

(51) Int. Cl.
 G02F 1/1362 (2006.01)
 H01L 27/12 (2006.01)
 G02F 1/1368 (2006.01)

(52) U.S. Cl.
 CPC ........ *G02F 1/136227* (2013.01); *G02F 1/1368* (2013.01); *G02F 1/136213* (2013.01); *G02F 1/136286* (2013.01); *H01L 27/1259* (2013.01); *G02F 2001/136295* (2013.01)

(58) Field of Classification Search
 CPC ................................................ G02F 1/136286
 See application file for complete search history.

(56) References Cited

U.S. PATENT DOCUMENTS 9,053,676 B2 6/2015 Jang et al.
2004/0239838 A1 12/2004 Lai
(Continued)

FOREIGN PATENT DOCUMENTS

CN 1790727 A 6/2006
CN 1959509 A 5/2007
(Continued)

*Primary Examiner* — Timothy L Rude
(74) *Attorney, Agent, or Firm* — Muncy, Geissler, Olds & Lowe, P.C.

(57) ABSTRACT

The present invention discloses a liquid crystal display (LCD) panel and method for forming the same. In the LCD panel, the TFT includes a source and a drain formed by a transparent conducting layer, and a gate formed by a metal layer. The source is electrically connected with a data line through a via hole over the data line. The source connects to the drain via an active layer. Whatever the number of data lines are, each pixel corresponds to an associated via hole, so the number of via holes does not increase, and not reduce the aperture ratio. Therefore, the present invention is very proper to a design using more data lines and working in a high frequency. Moreover, the matrix circuitry of LCD of the present invention is well applied in a display which not only increases a density of data lines to raise the frame rate, but also maintains the aperture ratio and brightness.

3 Claims, 19 Drawing Sheets

(56) References Cited

U.S. PATENT DOCUMENTS

2006/0186411 A1     8/2006    Kim et al.
2007/0126682 A1     6/2007    Liu et al.
2015/0362773 A1*   12/2015   Mu et al.

FOREIGN PATENT DOCUMENTS

| | | |
|---|---|---|
| CN | 101552277 A | 10/2009 |
| CN | 101762914 A | 6/2010 |

* cited by examiner

LCD PANEL AND METHOD FOR FORMING THE SAME

CROSS-REFERENCES TO RELATED APPLICATION

This application is a Continuation of co-pending application Ser. No. 14/463,986, filed on Aug. 20, 2014, which is a Divisional of application Ser. No. 13/000,924 filed on Dec. 22, 2010 which issued as U.S. Pat. No. 8,860,917 on Oct. 20, 2014, and which is a 371 of International Application No. PCT/CN2010/079558, filed on Dec. 8, 2010, for which priority is claimed under 35 U.S.C. §120; and this application claims priority of Application No. 201010564422.3 filed in China on Nov. 26, 2010 under 35 U.S.C. §119; the entire contents of all of which are hereby incorporated by reference.

BACKGROUND OF THE INVENTION

1. Field of the Invention

The present invention relates to a liquid crystal display (LCD) panel, and more particularly, to an LCD panel and method for forming the same where a transparent conducting layer is directly connected to a data line and a thin film transistor.

2. Description of Prior Art

An advanced monitor with multiple functions is an important feature for use in current consumer electronic products. Liquid crystal displays (LCDs) which are colorful monitors with high resolution are widely used in various electronic products such as monitors for mobile phones, personal digital assistants (PDAs), digital cameras, laptop computers, and notebook computers.

Please refer to FIG. 1 showing a layout of a pixel unit of a conventional liquid crystal display (LCD). The LCD includes a gate line 1, a data line 3, a common line 2, an active layer 6, a pixel electrode 9, and a storage capacitor 10. The pixel electrode. e.g. a transparent conducting layer made of indium tin oxide (ITO), is connected to the data line 3 through a via hole 5.

Generally speaking, a pixel corresponds to a scan line and a data line. Referring to FIG. 2 showing a cross section view along a line ABC shown in FIG. 1, the scan line 1 and a common line 2 is formed by a first metal layer, while the data line 3, a drain 4, and a source 5 are made of a second metal layer. Upon voltage delivered by the scan line 1 in an excess of a threshold voltage, data voltage from the data line 9 of the second metal layerM2 is delivered to the pixel electrode 9 by way of the second metal layerM2, the active layer 6, the second metal layerM2, the transparent conducting layer 7 on the via hole 8, and the pixel electrode 9. The pixel electrode 9 is charged based on voltage level of the data voltage, accordingly. As illustrated in the cross section view of FIG. 2, the common line 2 and the scan line 1 electrically connected with a gate which are formed by the first metal layer, the isolator layer 12, an ohmic connecting layer 13, the active layer 6, the source 5 and the drain 4 of a thin film transistor (TFT) which are formed by the second metal layer, the transparent conducting layer 7, and the passivation layer 11 are shown.

Currently, a development of the liquid crystal display technology is in a tendency to a LCD panel with a large frame and a high display quality. For a purpose of a high display quality, one approach is to increment a frame rate of the LCD panel. However, the current LCD panel having multiple transistors arranged in an active matrix is a standardized structure, which is a disadvantage of raising the frame rate. Please refer to FIG. 3 depicting a conventional structure of the active matrix circuitry. For example, for the LCD panel with a 1920×1080 resolution and a frame rate of 120 Hz in normal, a maximum effective charging time period $t_{charging\_120Hz}$ (without taking a blanking time period into consideration) is calculated as:

$$t_{\text{charging\_120Hz}} = \frac{1000000}{120 \times 1080} \approx 7.7(\mu\text{sec}).$$

By contrast, under a frame rate of 240 Hz, the maximum effective charging time period approximates to as 3.86μ seconds. It is too short to charge to required voltage level if considering RC delay and charging performance of TFT. In order to solve this problem, another approach is to double a number of data lines in the LCD panel. As shown in FIG. 4 illustrating a structure of an active matrix circuitry operating with a higher frame rate, two pixel electrodes on two neighboring rows are charged to predefined voltage levels in one gate-on time period with two data lines. As compared, two pixel electrodes on two neighboring rows of the traditional active matrix circuitry are charged to predefined voltage levels in two gate-on time periods. Even if operating in 240 Hz, the maximum effective charging time period of the active matrix circuitry shown in FIG. 4 is still 7.7μ seconds.

Refer to FIG. 5 showing a layout of three pixel electrodes on three consecutive rows to be simultaneously charged in one turn-on time period. Similar to above mentioned principle, three pixel electrodes 9a-9c on three consecutive rows to be simultaneously charged in one turn-on time period is realized by configuring a pair of via holes (circled area in dotted line) and a transparent conducting layer to link three neighboring data lines 3a-3c, so that data signal from the middle data line 3b can be transmitted to sources of the corresponding TFTs. Such design reduces a aperture ratio and degrades display brightness.

In sum, it is proper for implementing two pixel electrodes on two neighboring rows to be simultaneously charged in one turn-on time period. In other words, for keeping the aperture ratio and display brightness, the frame rate is at least 240 Hz considering a RC delay and a charging performance of a TFT.

Therefore, it is necessary for providing a novelty LCD panel capable of raising frame rate to solve the problems existing in prior art.

SUMMARY OF THE INVENTION

An objective of the present invention is to provide a LCD liquid crystal display (LCD) panel and a method of forming the same to raising an aperture ratio of the LCD panel to improve a transmittance of the LCD panel.

In one aspect of the present invention, a method of forming a liquid crystal display (LCD) panel comprises: a glass substrate is provided; a first metal layer formed on the glass substrate is etched to form a data line; a first passivation layer and a second metal layer are deposited on the glass substrate and on the first metal layer in order; the second metal layer is etched to form a gate of a thin film transistor and a bottom electrode of a storage capacitor; an isolation layer and an active layer are deposited on the first passivation layer and on the second metal layer in order; the active layer is etched simultaneously for reserving the active layer above the control electrode, and the active layer functions as a channel of the thin film transistor; the first passivation layer and the isolation layer above the data line are etched to form a via hole on top of the data line; a transparent conducting layer is deposited on the isolation layer, the data line, and the active layer; and the transparent conducting layer is etched to divide the transparent conducting layer into a first electrode and a second electrode, wherein the data line is electrically connected to the active layer through the first electrode on the via hole, and the active layer is electrically connected to the second electrode.

In another aspect of the present invention, an LCD panel comprises a glass substrate and a plurality of pixel units, each pixel unit is disposed on the glass substrate and electrically connected to a scan line and a data line. Each pixel unit comprises: a first metal layer, disposed on the glass substrate, for forming a data line; a first passivation layer, disposed on the glass substrate and on the first metal layer; a second metal layer, disposed on the first passivation layer, for forming a gate of a thin film transistor and a bottom electrode of a storage capacitor; an isolation layer, disposed on the first passivation layer and the second metal layer; an active layer, disposed on the isolation layer, for functioning as a channel of the switch unit; a via hole, formed on top of the data line; and a transparent conducting layer, disposed on the isolation layer and on the via hole, comprising a first electrode and a second electrode, the first electrode electrically connected to the data line, the second electrode functioning as a pixel electrode. Upon receiving a scan voltage by the gate, a data voltage from the data line is transmitted to the second electrode through the first electrode and the active layer.

In still another aspect of the present invention, a method of forming a liquid crystal display (LCD) panel, characterized in that the method comprises: a glass substrate is provided; a first metal layer formed on the glass substrate is etched to form a gate of a thin film transistor and a bottom electrode of a storage capacitor; a first passivation layer and a second metal layer are deposited on the glass substrate and on the first metal layer in order; the second metal layer is etched to form a data line; an isolation layer and an active layer are deposited on the first passivation layer and on the second metal layer in order; the active layer is etched simultaneously for reserving the active layer above the control electrode, and the active layer functions as a channel of the thin film transistor; the first passivation layer and the isolation layer above the data line are etched to form a via hole on top of the data line; a transparent conducting layer is deposited on the isolation layer, the data line, and the active layer; and the transparent conducting layer is etched to divide the transparent conducting layer into a first electrode and a second electrode, wherein the data line is electrically connected to the active layer through the first electrode on the via hole, and the active layer is electrically connected to the second electrode.

In yet another aspect of the present invention, an LCD panel comprises a glass substrate and a plurality of pixel units. Each pixel unit is disposed on the glass substrate and electrically connected to a scan line and a data line. Each pixel unit comprises: a first metal layer, disposed on the glass substrate, for functioning as a gate of a thin film transistor and a bottom electrode of a storage capacitor; a first passivation layer, disposed on the glass substrate and on the first metal layer; a second metal layer, disposed on the first passivation layer, for forming as a data line; an isolation layer, disposed on the first passivation layer and the second metal layer; an active layer, disposed on the isolation layer, for functioning as a channel of the thin film transistor; a via hole, formed on top of the data line; and a transparent conducting layer, disposed on the isolation layer and on the via hole, comprising a first electrode and a second electrode, the first electrode electrically connected to the data line, the second electrode functioning as a pixel electrode. Upon receiving a scan voltage by the gate, a data voltage from the data line is transmitted to the second electrode through the first electrode and the active layer.

In contrast to the prior art, the LCD panel and method for forming the same of the present invention can produce LCD panels with a new TFT structure using a five-mask process. In the LCD panel, a transparent conducting layer forms a first electrode and a second electrode of a TFT directly. Meanwhile, the transparent conducting layer also serves as a connecting line between a TFT and a data line and between a TFT and an LC capacitor, without forming a via hole over the TFT to link the TFT and the transparent conducting layer. In this way, an area of a pixel electrode can be further extended, and the aperture ratio of an LCD panel can be also increased, raising a transmittance of light from light sources passing through the pixel electrode.

These and other features, aspects and advantages of the present disclosure will become understood with reference to the following description, appended claims and accompanying figures.

DETAILED DESCRIPTION OF THE PREFERRED EMBODIMENTS

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Refer to FIGS. 6 to 14, which illustrate schematic diagrams of the LCD panel forming process according to a first embodiment of the present invention. Firstly, refer to FIG. 6. During this stage of the forming process, firstly, a first metal layer (not shown) is deposited on a glass substrate 201. Meanwhile, a developing process is implemented through a first mask. The developing process contains the following steps: coating a photoresist (not shown) on the first metal layer, exposing the photoresist through the first mask having a specific pattern, and then washing out the exposed photoresist with a developer. Afterwards, the first metal layer undergoes an etching process. The etching process includes the steps of: removing the first metal layer, which is not covered by the photoresist, with a strong acid, producing a data line 22 on the first metal layer covered by the photoresist (roughly showing the specific pattern), and washing out the remaining photoresist.

Figure 1:
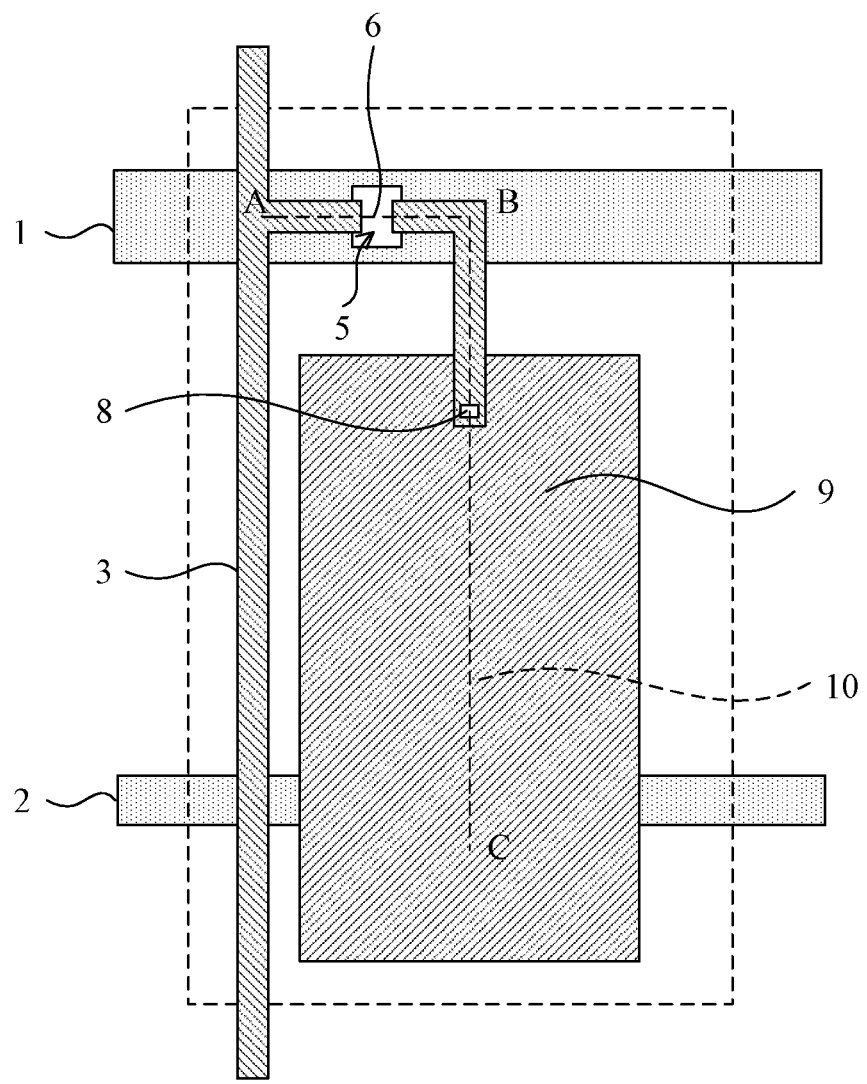
FIG. 1 shows a layout of a pixel unit of a conventional liquid crystal display (LCD).
Figure 2:
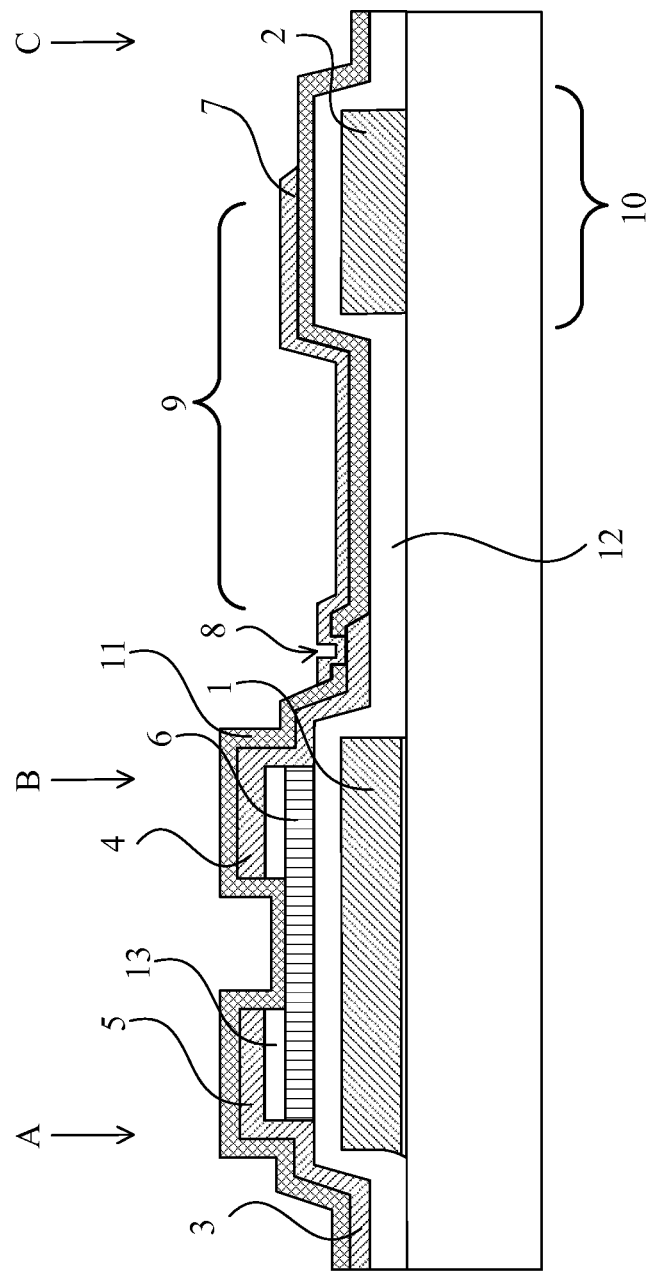
FIG. 2 shows a cross section view along a line ABC shown in FIG. 1.
Figure 3:
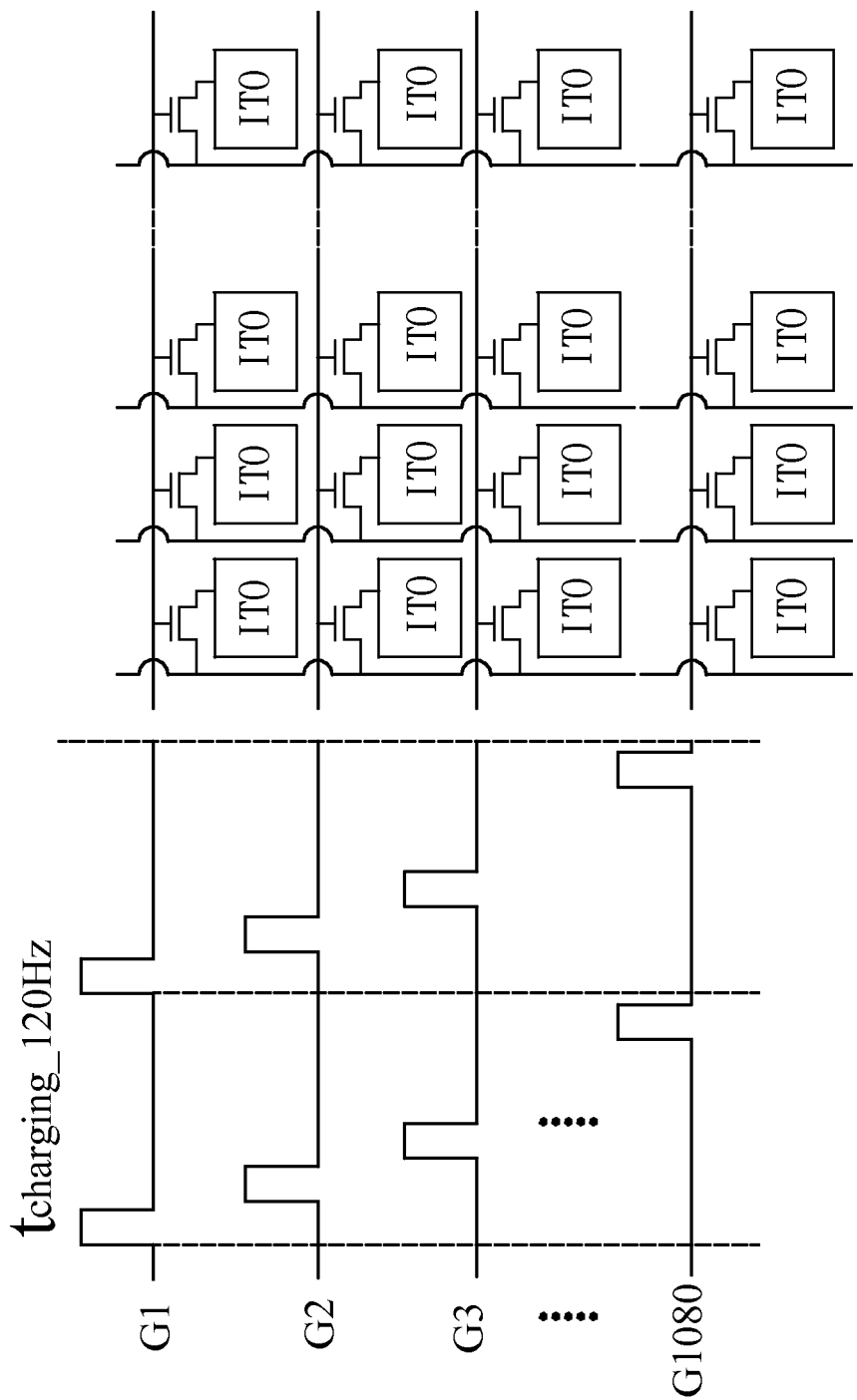
FIG. 3 depicts a conventional structure of the active matrix circuitry.
Figure 4:
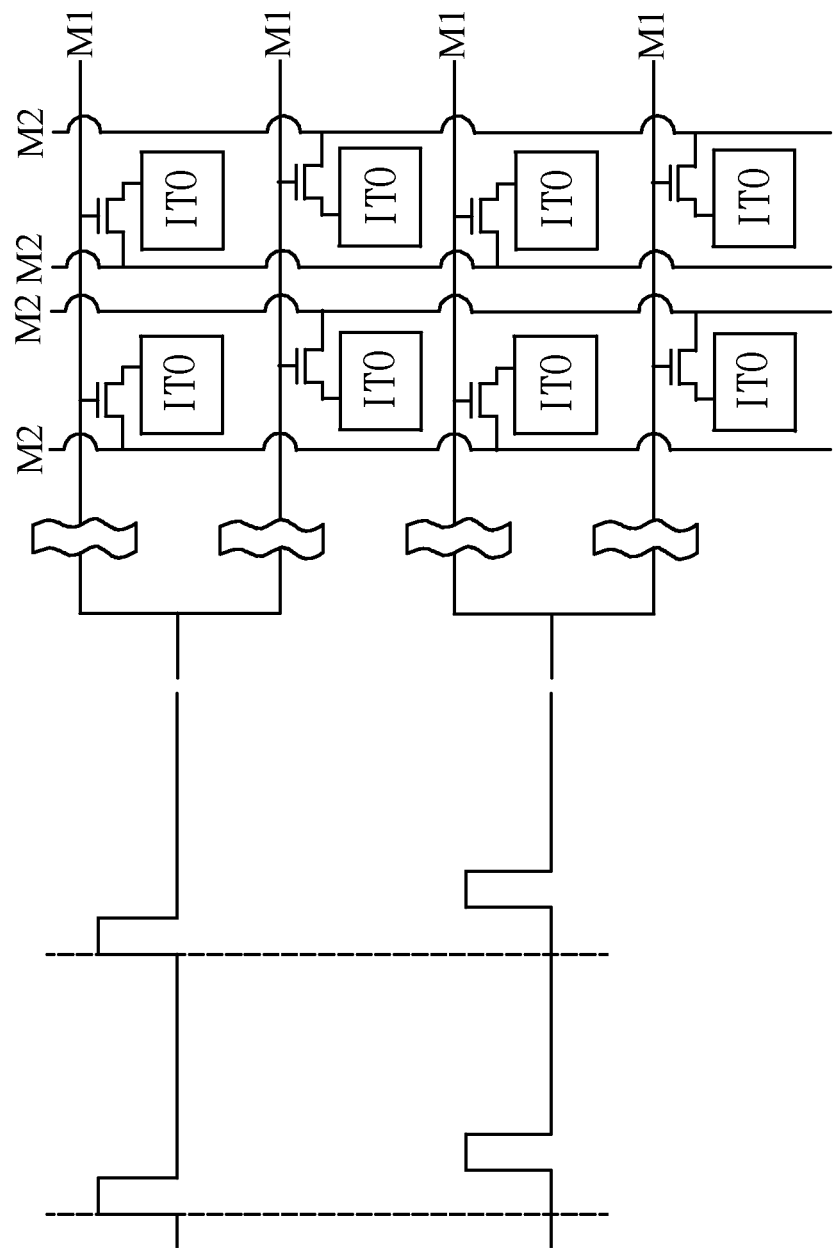
FIG. 4 illustrates a structure of an active matrix circuitry operating with a higher frame rate.
Figure 5:
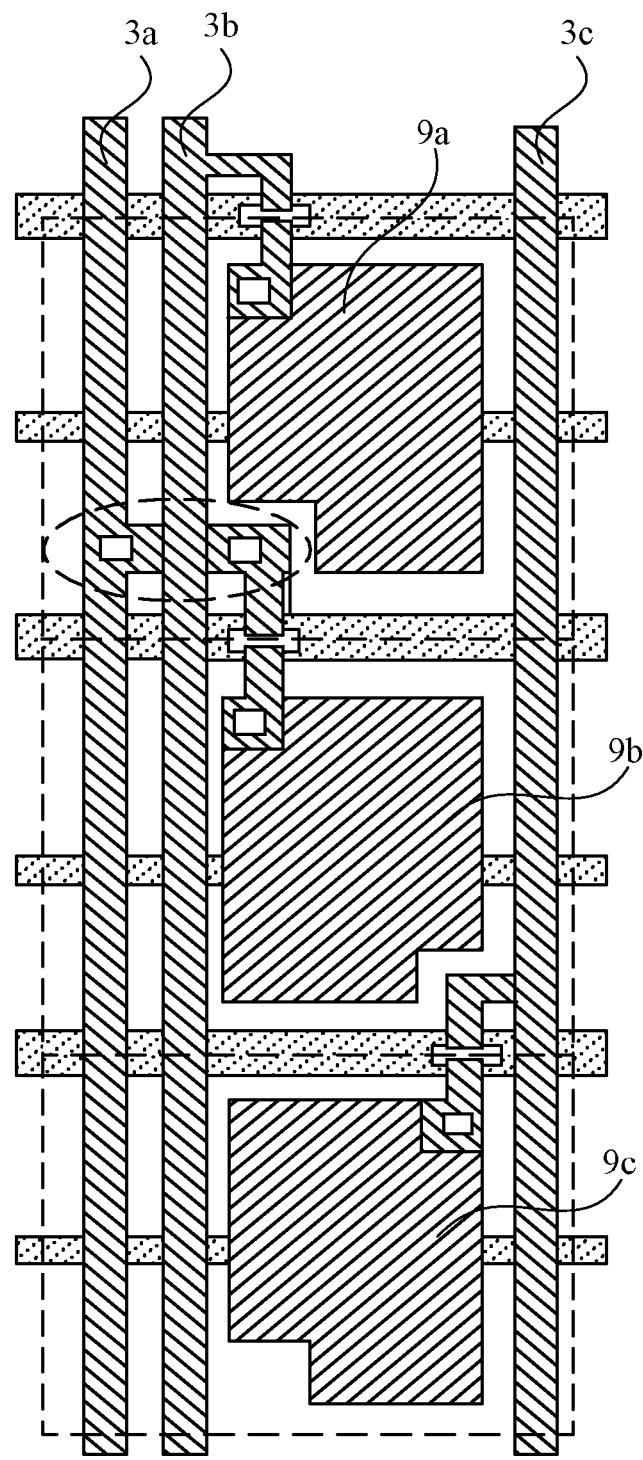
FIG. 5 shows a layout of three pixel electrodes on three consecutive rows to be simultaneously charged in one turn-on time period.
Figure 6:
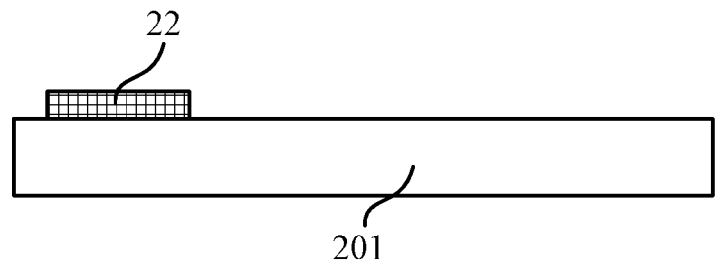
FIGS. 6 to 14 illustrate schematic diagrams of the LCD panel forming process according to a first embodiment of the present invention.
Figure 7:
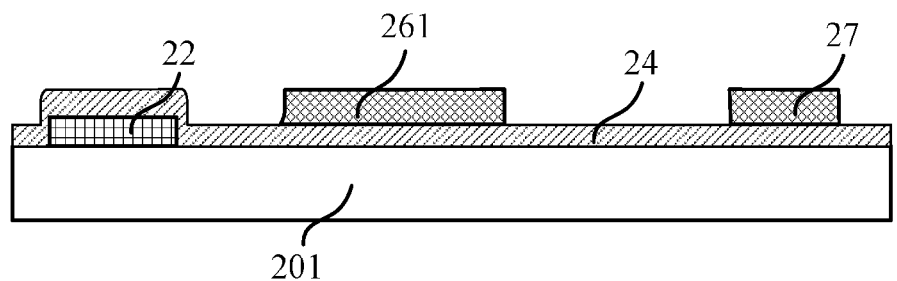

Refer to FIG. 7. During this stage of the forming process, firstly, a first passivation layer 24 is deposited on the glass substrate 201 and the first metal layer. Next, a second metal layer (not shown) is deposited on the first passivation layer 24. Next, a developing process is implemented through a second mask. Meanwhile, the second metal layer undergoes an etching process in order to generate a gate 261 and a common line 27.

Figure 8:
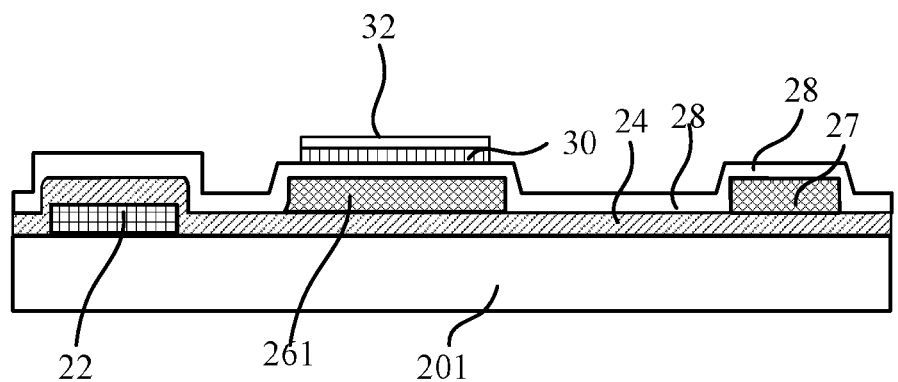

Refer to FIG. 8. During this stage of the forming process, firstly, an isolation layer 28 is deposited on the gate 261, the common line 27 and the first passivation layer 24. Next, an active layer 30 and an ohmic contact layer 32 are deposited on the isolation layer 28 in order. Subsequently, a developing process is implemented through a third mask. Meanwhile, the active layer 30 and the ohmic contact layer 32 undergo an etching process in order to reserve the active layer 30 and the ohmic contact layer 32 corresponding to the top of the gate 261.

Figure 9:
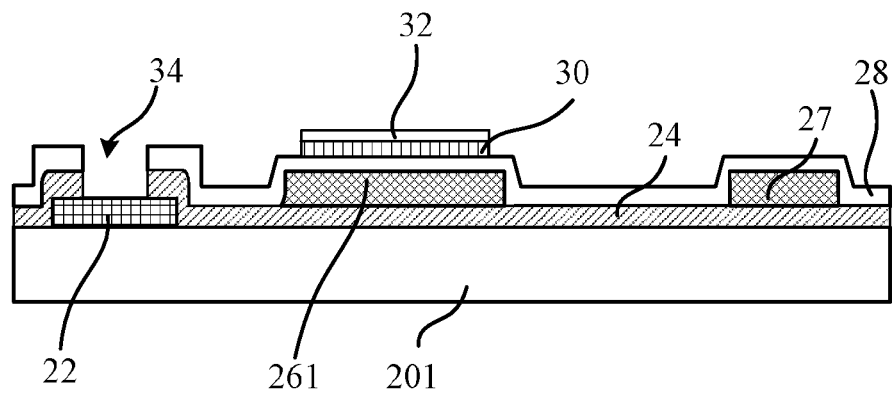

Refer to FIG. 9. During this stage of the forming process, a developing process is implemented through a fourth mask. Meanwhile, the isolation layer 28 and the first passivation layer 24 undergo an etching process until the data line 22 is exposed, so as to form a via hole 34.

Figure 10:
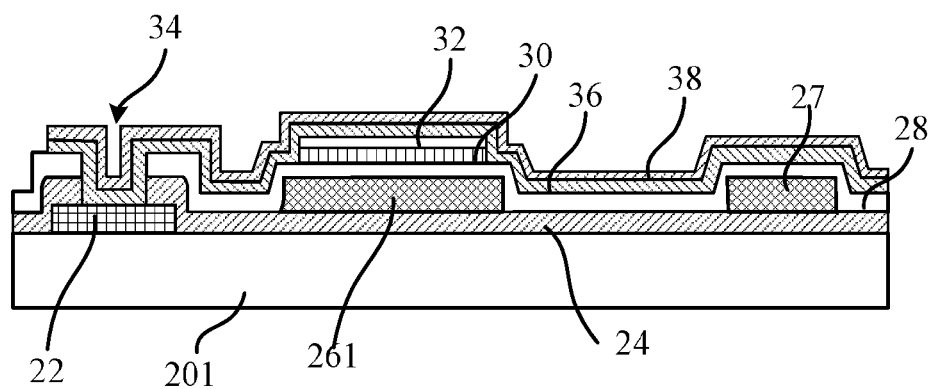

Refer to FIG. 10. During this stage of the forming process, firstly, a transparent conducting layer 36 is deposited. Next, a layer of photoresist 38 is coated on top of the transparent conducting layer 36. Preferably, the transparent conducting layer 36 may be indium tin oxide (ITO).

Figure 11:
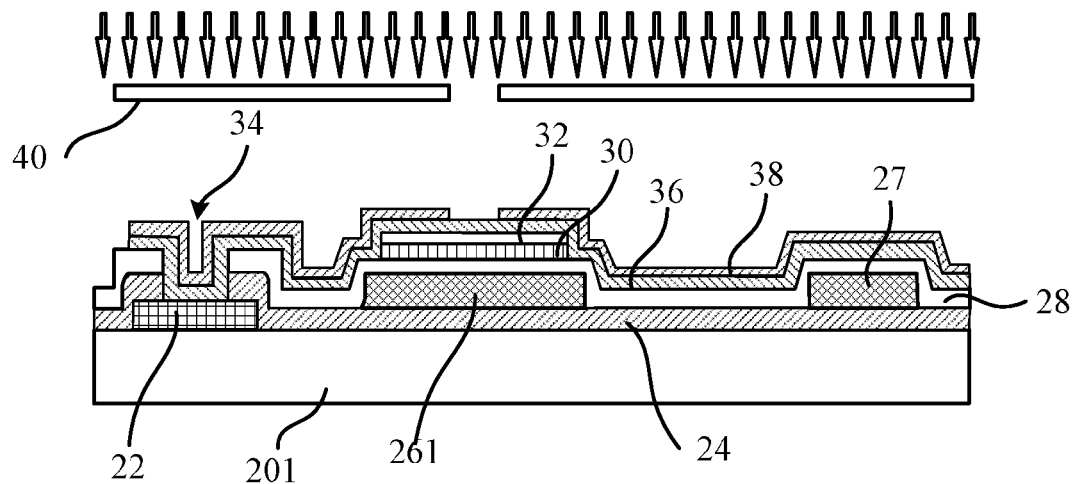

Refer to FIG. 11. During this stage of the forming process, the photoresist 38 is exposed through a fifth mask 40. After the photoresist 38 is radiated by the ultraviolet light, a solubility of the exposed photoresist 38 to the developer is changed. Therefore, the exposed photoresist 38 can be easily washed out with the developer.

Figure 12:
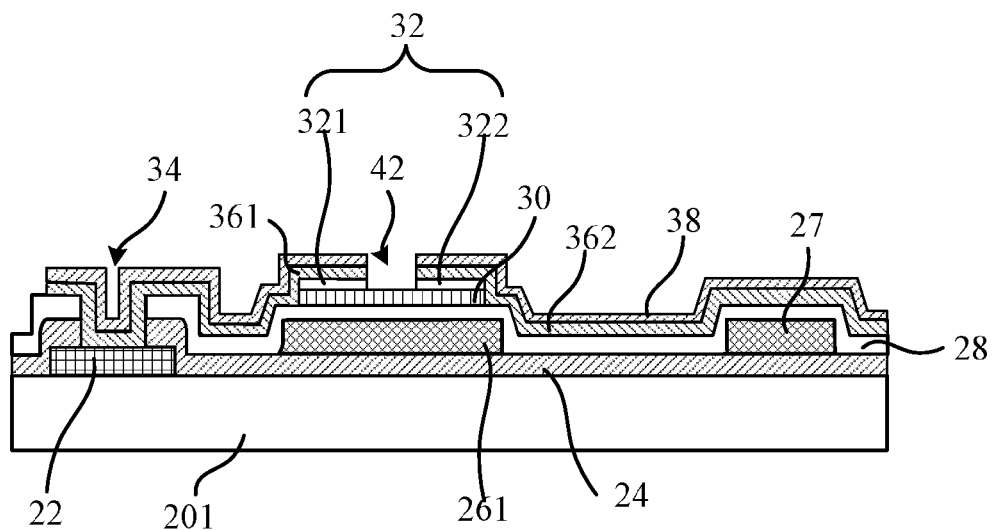

Refer to FIG. 12. During this stage of the forming process, a portion of the transparent conducting layer 36 and the ohmic contact layer 32, where the photoresist 38 does not cover, is removed by performing an etching process to form an opening 42. The opening 42 is formed on top of the gate 261. The ohmic contact layer 32 at both sides of the opening 42 forms a first ohmic contact layer 321 and a second ohmic contact layer 322, respectively.

Figure 13:
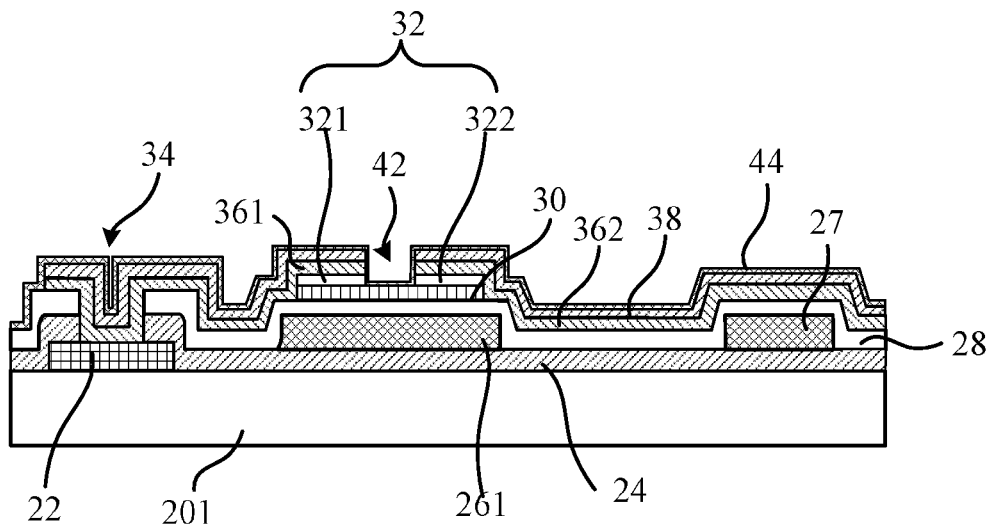

Refer to FIG. 13. During this stage of the forming process, a second passivation layer 44 is deposited on the remaining photoresist 38 and inside the opening 42 before the remaining photoresist 38 is removed.

Figure 14:
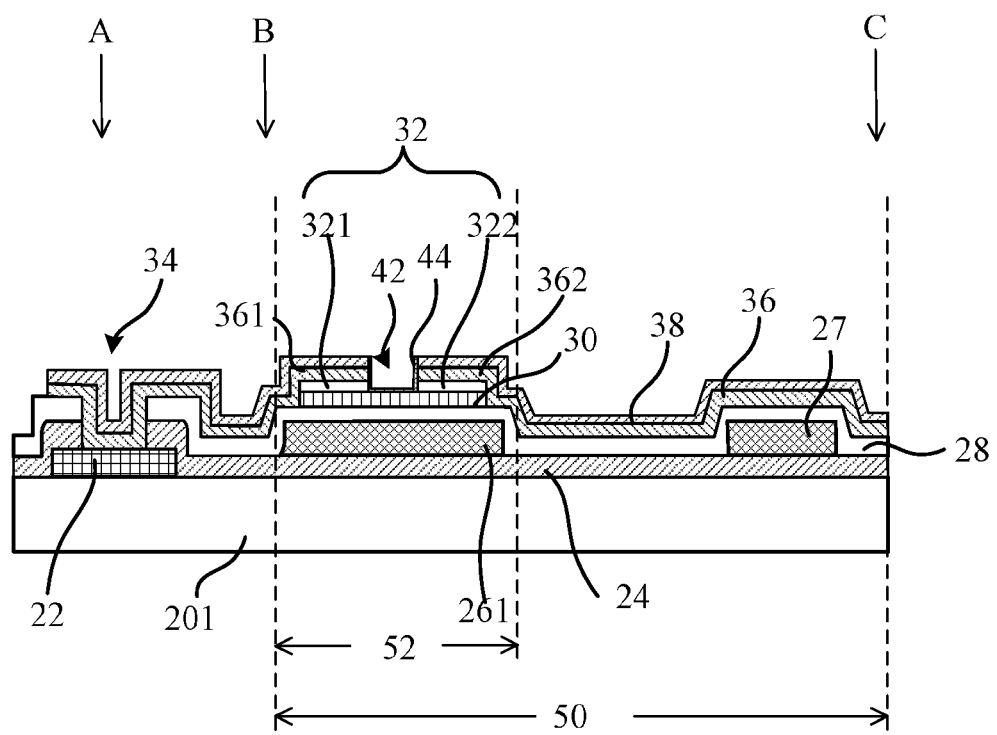

Refer to FIG. 14. During this stage of the forming process, both of the photoresist 38 and the second passivation layer 44 deposited on the photoresist 38 are lifted off. The second passivation layer 44 inside the opening 42 is prevented from being lifted off because it does not adhere to the photoresist 38. Thus, the second passivation layer 44 adheres to the inner surface of the opening 42 and to the top of the active layer 30 corresponding to the opening 42.

Figure 15:
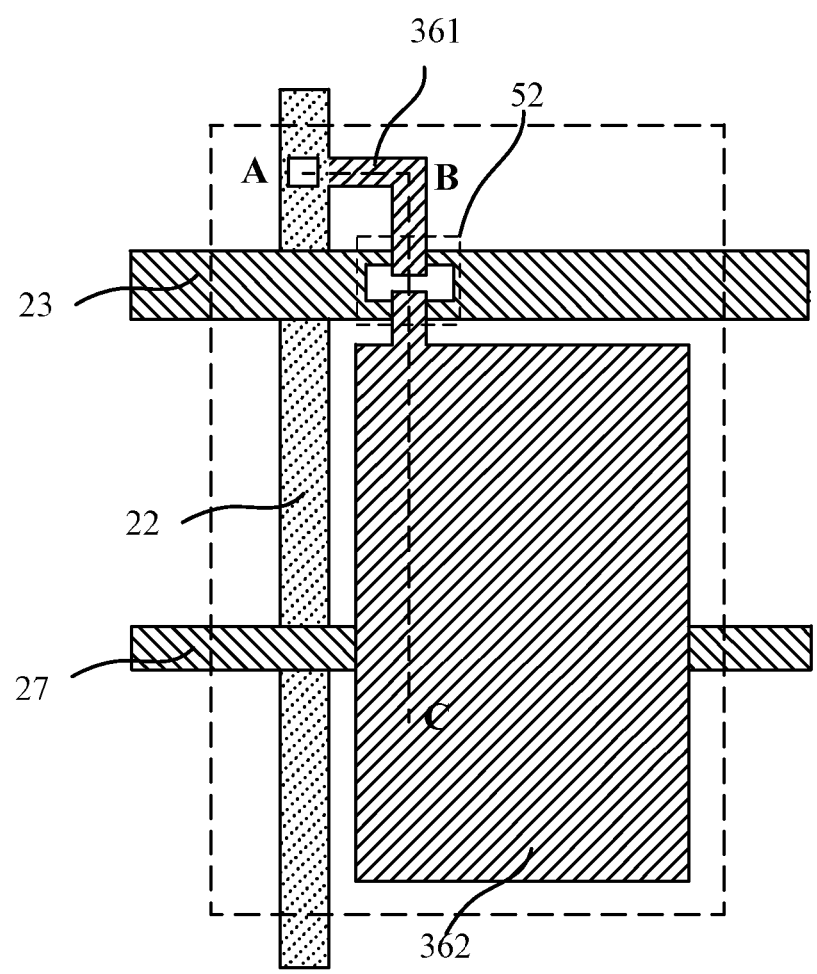
FIG. 15 shows a top view of pixel unit shown in FIG. 14.
Figure 16:
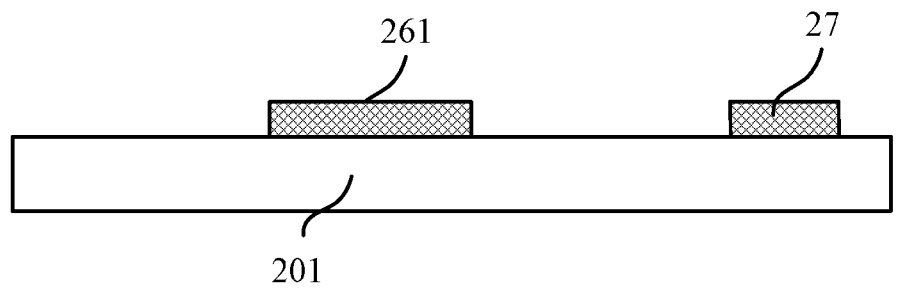
FIGS. 16 to 24 are schematic diagrams of the LCD panel forming process according to a second embodiment of the present invention.

Refer to FIG. 14 in conjunction to FIG. 15 showing a top view of a pixel unit 50 shown in FIG. 14. FIG. 14 shows a cross-sectional view along a line A-B-C shown in FIG. 15. The transparent conducting layer 36 is divided into a first transparent conducting layer 361 and a second transparent conducting layer 362 by the opening 42. In addition to the gate 261, the first electrode 361 and the second electrode 362 function as a source (or a drain) and a drain (or a source) of the TFT 52, and the active layer 30 functions as a channel of the TFT 52 between the source and the drain. The first electrode 361 is capable of outputting or inputting electrical signals. Correspondingly, the second electrode 362 is capable of outputting or inputting electrical signals as well. An object of the second passivation layer 44 adhering to the opening 42 is to separate the ohmic contact layer 32 from the active layer 30 functioning as the channel, so that the active layer 30 and the ohmic contact layer 32 are prevented from approaching the LC molecules directly and further from affecting the alignment of LC molecules. The second electrode 362 serves as not only the source (or the drain) of the TFT 52 but also, practically, a pixel electrode (as shown in FIG. 15). When the TFT 52 receives a scanning voltage from the scan line 23, a data voltage transmitted from the data line 22 is transmitted to the second electrode 362 (i.e., the pixel electrode) through the first electrode 361 and the TFT 52. The alignment of the LC molecules over the second electrode 362 is adjusted according to the data voltage applied on the second electrode 362, which decides the transmittance of light beams. Besides, the common line 27 is used for supplying a common voltage Vcom. A storage capacitor 56, formed by an overlap of the second electrode 362 and the common line 27, is used for keeping data voltage. That is, the alignment of the LC molecules over the second electrode 362 is determined according to stored voltage in the storage capacitor 56 when the TFT 52 does not receive the scanning signal.

Refer to FIGS. 16 to 24, which are schematic diagrams of the LCD panel forming process according to a second embodiment of the present invention. Firstly, refer to FIG. 16. During this stage of the forming process, firstly, a first metal layer (not shown) is deposited on a glass substrate 201. Meanwhile, a developing process is implemented through a first mask. Afterwards, the first metal layer is etched to generate a gate 261 of a switch unit and common line 27.

Figure 17:
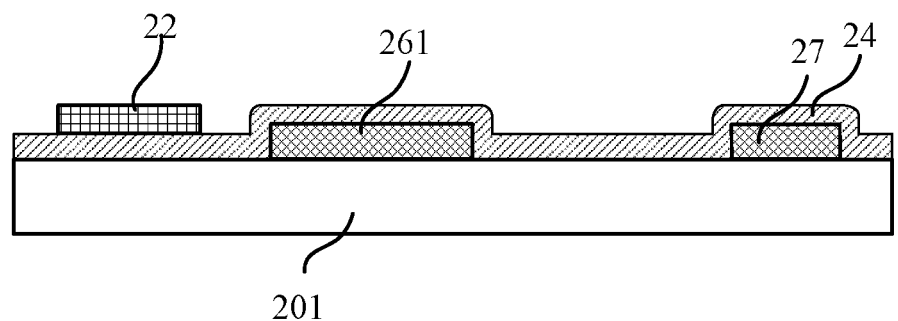

Refer to FIG. 17. During this stage of the forming process, firstly, a first passivation layer 24 is deposited on the glass substrate 201 and the first metal layer. Next, a second metal layer (not shown) is deposited on the first passivation layer 24. Next, a developing process is implemented through a second mask. Meanwhile, the second metal layer undergoes an etching process in order to generate a data line 22.

Figure 18:
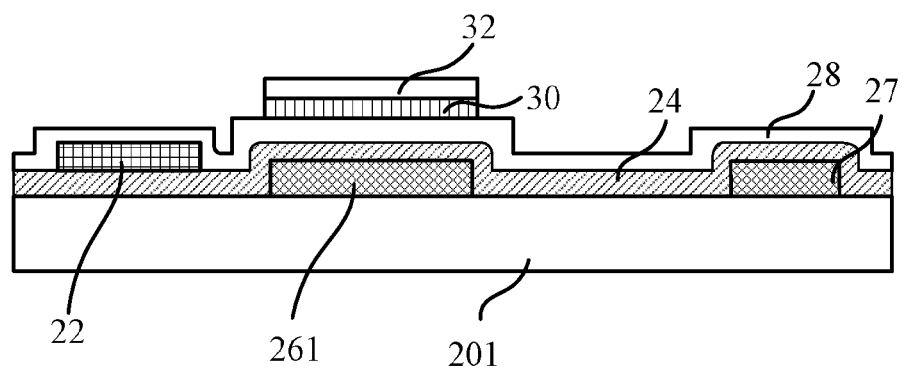

Refer to FIG. 18. During this stage of the forming process, firstly, an isolation layer 28 is deposited on the data line 22 and the first passivation layer 24. Next, an active layer and an ohmic contact layer are deposited on the isolation layer 28 in order. Subsequently, a developing process is implemented through a third mask. Meanwhile, the active layer and the ohmic contact layer undergo an etching process in order to reserve the active layer 30 and the ohmic contact layer 32 corresponding to the top of the gate 261.

Figure 19:
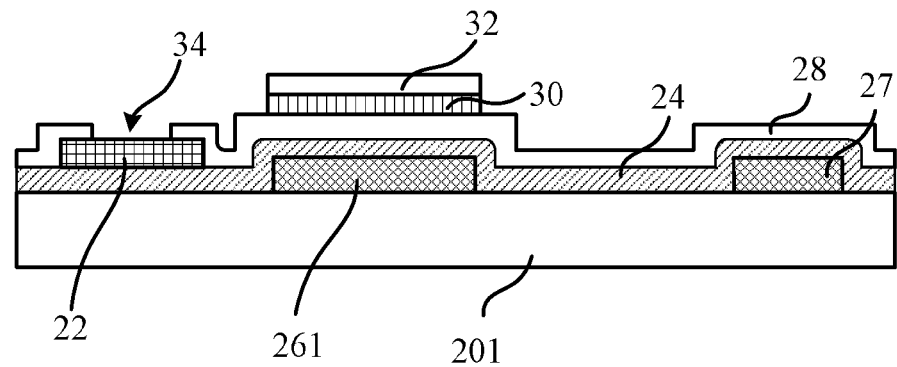

Refer to FIG. 19. During this stage of the forming process, a developing process is implemented through a fourth mask. Meanwhile, the first passivation layer 24 undergo an etching process until the data line 22 is exposed, and a via hole 34 is formed.

Figure 20:
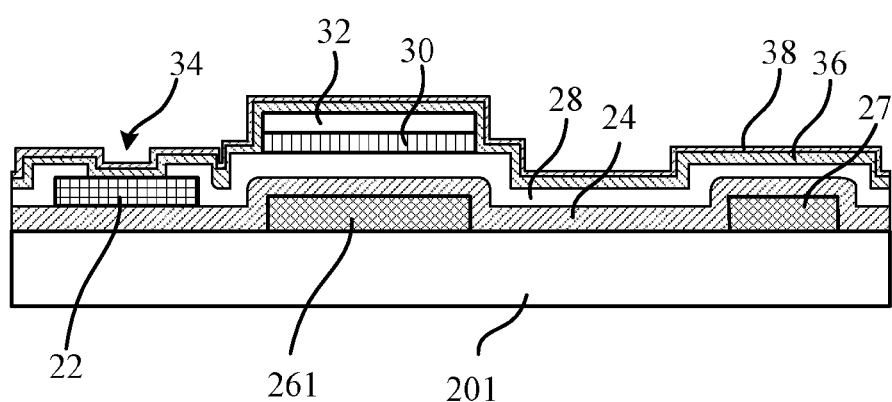

Refer to FIG. 20. During this stage of the forming process, firstly, a transparent conducting layer 36 is deposited. Next, a layer of photoresist 38 is coated on top of the transparent conducting layer 36. Preferably, the transparent conducting layer 36 may be made of indium tin oxide (ITO).

Figure 21:
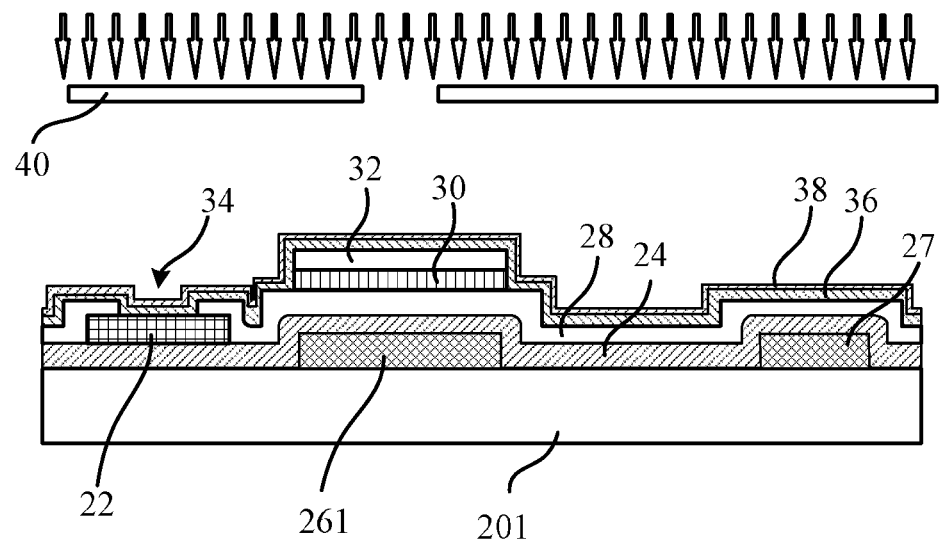

Refer to FIG. 21. During this stage of the forming process, the photoresist 38 is exposed through a fifth mask 40. After the photoresist 38 is radiated by the ultraviolet light, a solubility of the exposed photoresist 38 to the developer is changed. Therefore, the exposed photoresist 38 can be easily washed out with the developer.

Figure 22:
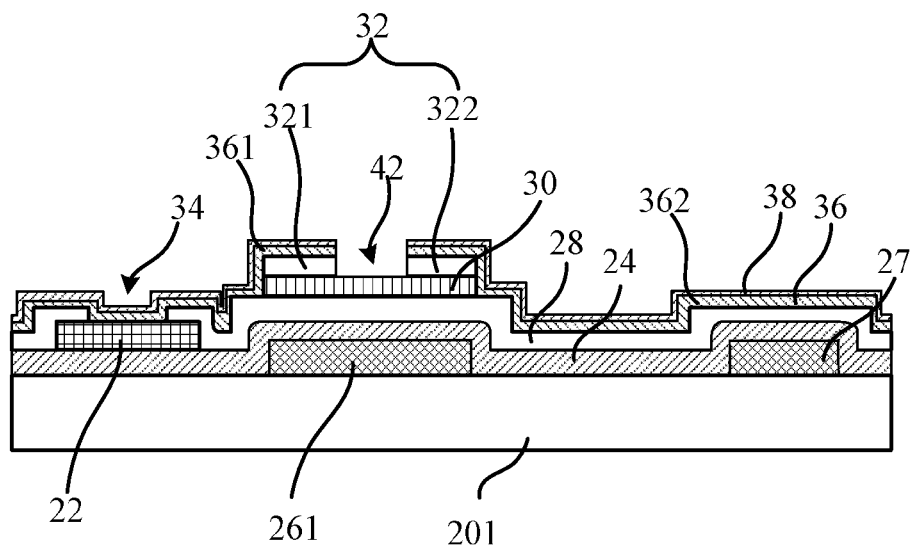

Refer to FIG. 22. During this stage of the forming process, a portion of the transparent conducting layer 36 and the ohmic contact layer 32, where the non-exposed photoresist 38 does not cover, is removed by performing an etching process to form an opening 42. The opening 42 is formed on top of the gate 261. The ohmic contact layer 32 at both sides of the opening 42 forms a first ohmic contact layer 321 and a second ohmic contact layer 322, respectively.

Figure 23:
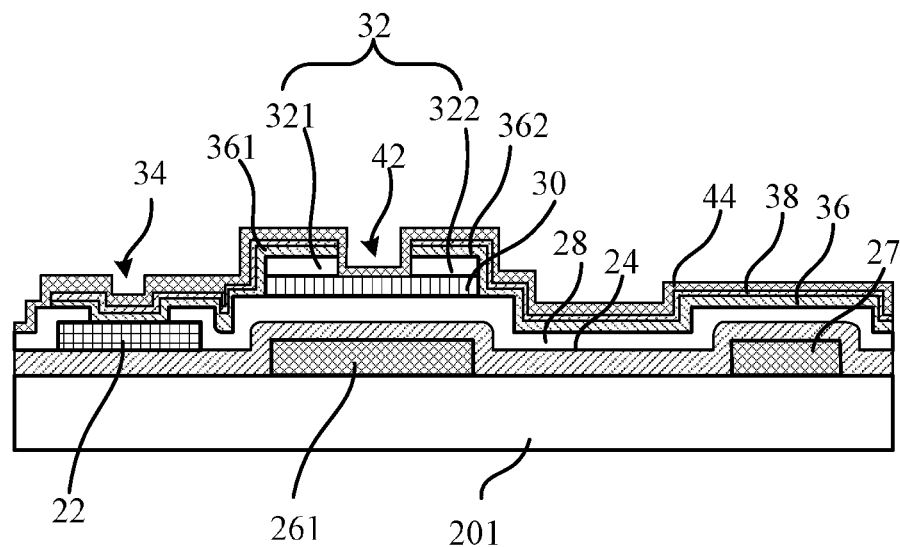

Refer to FIG. 23. During this stage of the forming process, a second passivation layer 44 is deposited on the remaining photoresist 38 and inside the opening 42 before the remaining photoresist 38 is removed.

Figure 24:
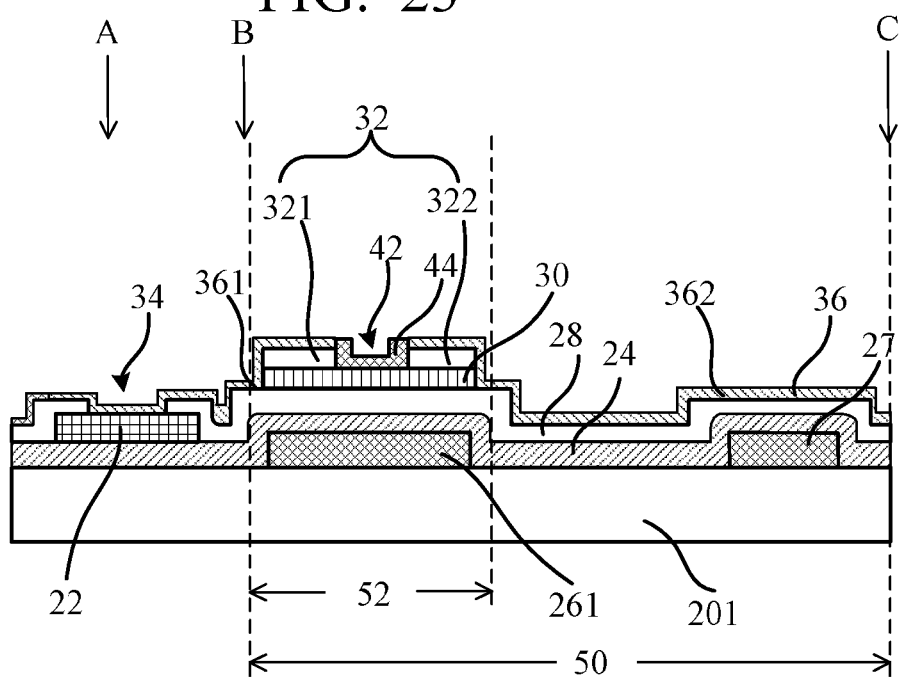

Refer to FIG. 24. During this stage of the forming process, both of the photoresist 38 and the second passivation layer 44 deposited on the photoresist 38 are lifted off. The second passivation layer 44 inside the opening 42 is prevented from being lifted off because it does not adhere to the photoresist 38. Thus, the second passivation layer 44 adheres to the inner surface of the opening 42 and to the top of the active layer 30 corresponding to the opening 42, for isolating the active layer 30 from liquid crystal molecules.

Figure 25:
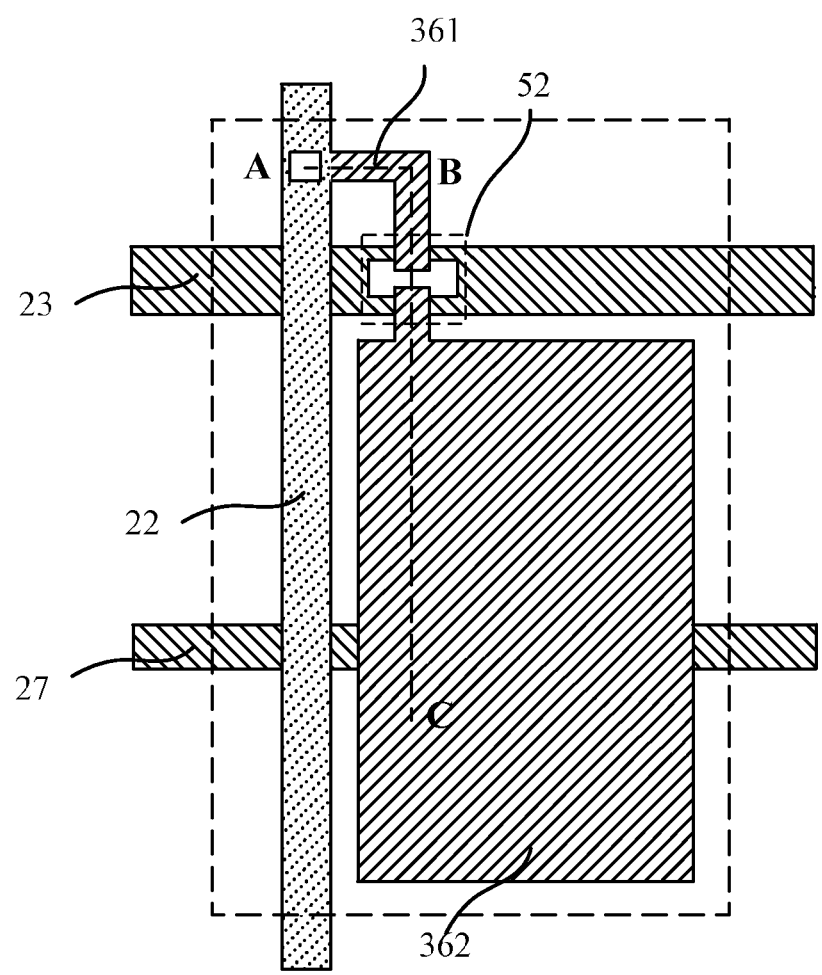
FIG. 25 shows a top view of pixel unit 50 shown in FIG. 24.

Refer to FIG. 24 in conjunction to FIG. 25 showing a top view of the pixel unit 50 shown in FIG. 24. FIG. 24 shows a cross-sectional view along a line A-B-C shown in FIG. 25. The transparent conducting layer 36 is divided into a first transparent conducting layer (a first electrode) 361 and a second transparent conducting layer (a second electrode) 362 by the opening 42. In addition to the gate 261, the first electrode 361 and the second electrode 362 function as a source (or a drain) and a drain (or a source) of the TFT 52, and the active layer 30 function as a channel of TFT 52 between the source and the drain. The first electrode 361 is capable of outputting or inputting electrical signals. Correspondingly, the second electrode 362 is capable of outputting or inputting electrical signals as well. An object of the second passivation layer 44 adhering to the opening 42 is to separate the ohmic contact layer 32 from the active layer 30 functioning as the channel, so that the active layer 30 and the ohmic contact layer 32 are prevented from approaching the LC molecules directly and further affecting the alignment of LC molecules. The second electrode 362 serves as not only a source (or a drain) of the TFT 52 but also, practically, the pixel electrode (as shown in FIG. 15). When the TFT 52 receives a scanning voltage from the scan line 23, a data voltage transmitted from the data line 22 is transmitted to the second electrode 362 (i.e., the pixel electrode) through the first electrode 361 and the TFT 52. The alignment of the LC molecules over the second electrode 362 is adjusted according to the data voltage applied on the second electrode 362, which decides the transmittance of light beams. Besides, the common line 27 is used for supplying a common voltage Vcom. A storage capacitor 56, formed by an overlap of the second electrode 362 and the common line 27, is used for keeping data voltage. That is, the alignment of the LC molecules over the second electrode 362 is determined according to stored voltage in the storage capacitor 56 during which the TFT 52 does not receive the scanning signal.

As shown in FIG. 14 or FIG. 24, the first ohmic contact layer 321 and the second ohmic contact layer 322 of the ohmic contact layer 32 of the present invention is used for decreasing the resistance of the TFT 52. In another embodiment, the ohmic contact layer 32 may be unnecessary during the forming process, so the first ohmic contact layer 321 and the second ohmic contact layer 322 may be also not necessary for the TFT 52.

It is noted that a difference between the TFTs 52 shown in FIGS. 15 and 25 is a sequence of forming the common line 27, the gate 261, and the data line 22. For the embodiment illustrated in FIG. 15, the data line 22 is formed prior to the common line 27 and the gate 261; correspondingly, for the embodiment illustrated in FIG. 25, the data line 22 is formed subsequent to the common line 27 and the gate 261.

Figure 26:
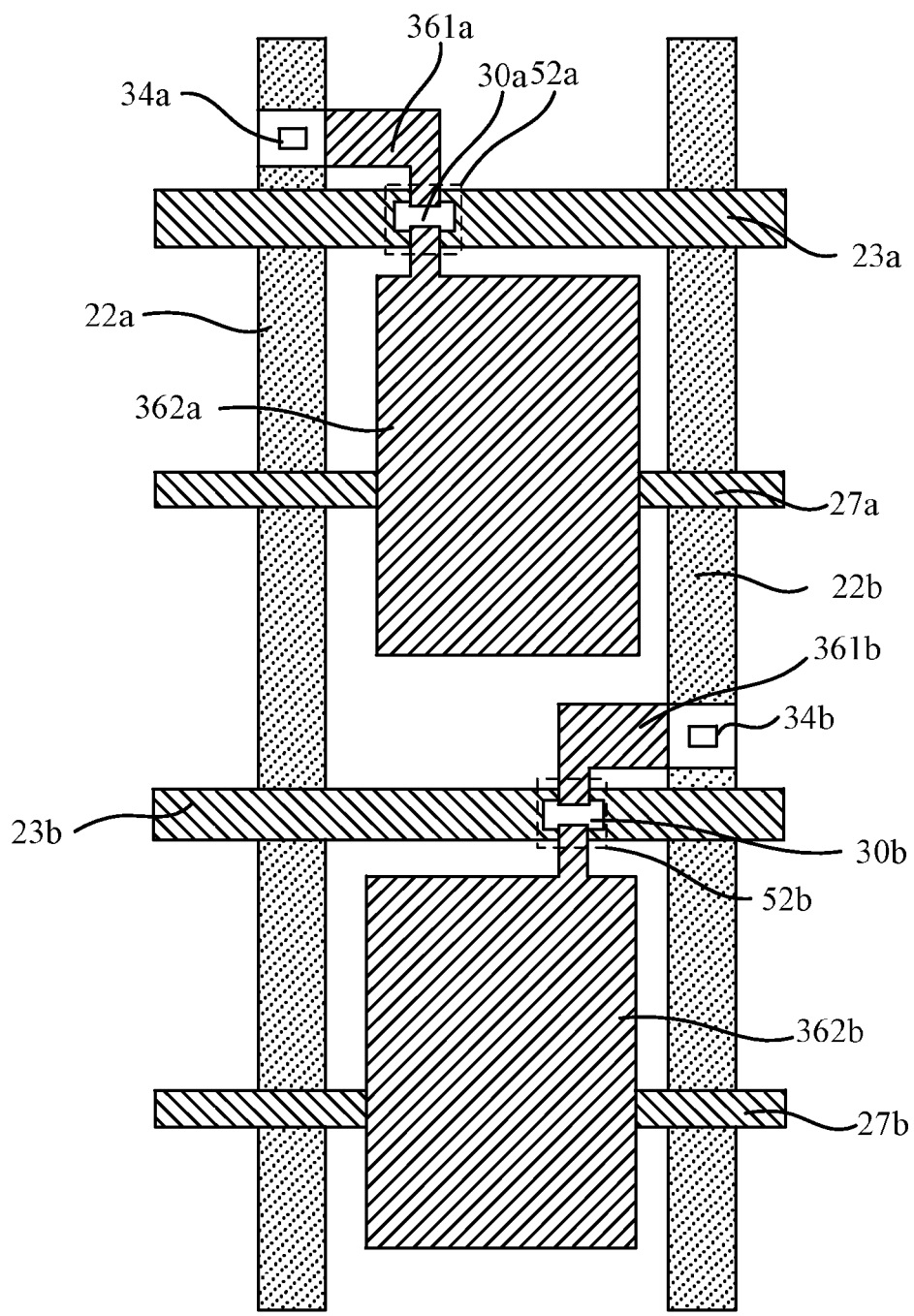
FIG. 26 shows a layout of the pixel units according to a first embodiment of the present invention.

With reference to FIG. 26 showing a layout of the pixel units according to a first embodiment of the present invention, two TFTs 52a and 52b are located at two areas, and the data lines 22a and 22b are disposed in parallel and in perpendicular to the scan lines 23a and 23b within the two areas. The data lines 22a and 22b are disposed at both sides of the pixel electrodes 362a, 362b. The second electrode (i.e, the pixel electrode) 362a within the upper area is electrically connected to the first electrode 361a through the active layer 30a, and further electrically connected to data line 22a at left side through the via hole 34a. The second electrode (i.e, the pixel electrode) 362b within the lower area is electrically connected to the first electrode 361a through the active layer 30a, and further electrically connected to data line 22b at right side through the via hole 34b. The second electrodes 362a and 362b of the TFTs 52a and 52b are electrically connected to the data lines 22a and 22b by means of the via holes 34a and 34b formed on top of the data lines 22a and 22b, and the gates (not shown) of the TFTs 52a and 52b are electrically connected to the scan lines 23a and 23b. Because the via holes 34a and 34b are formed over the metal layer of the data lines 22a and 22b, not only an aperture ratio and brightness of each pixel unit is not decreased but also the frame rate is raised.

Figure 27:
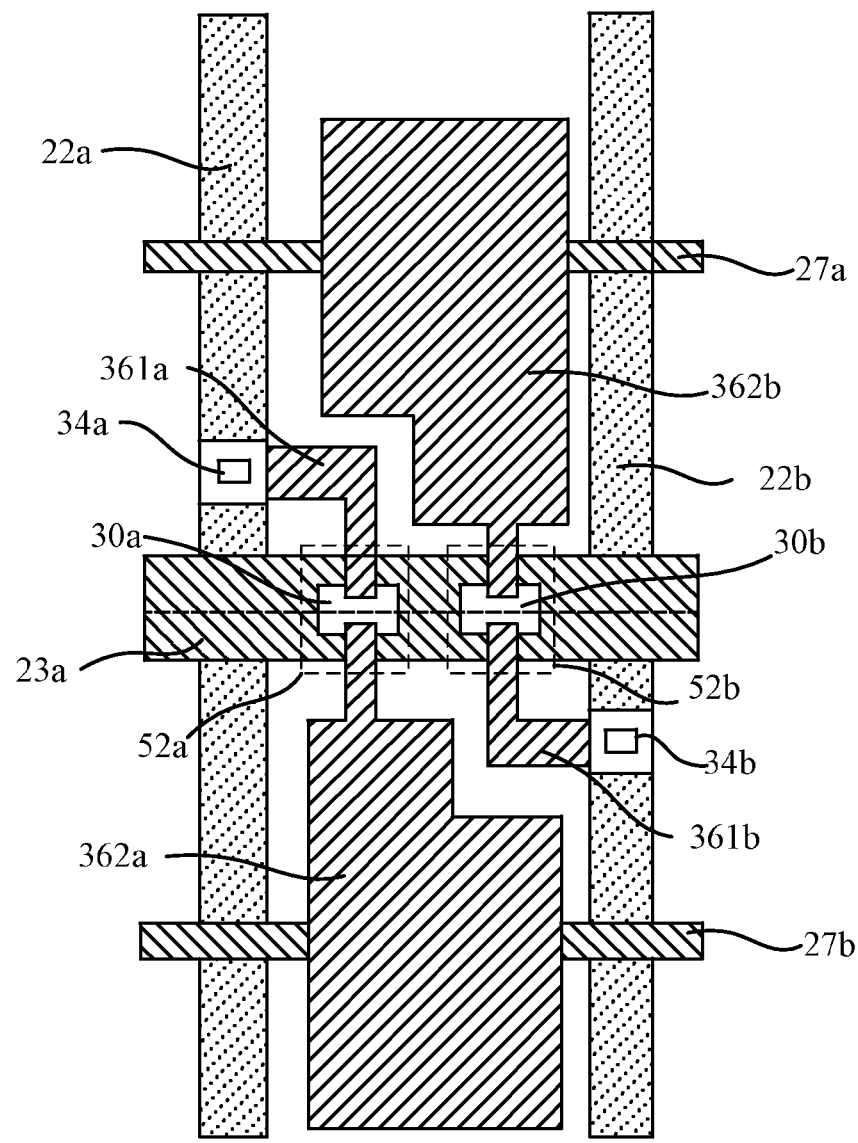
FIG. 27 shows a layout of the pixel units according to a second embodiment of the present invention.

With reference to FIG. 27 showing a layout of the pixel units according to a second embodiment of the present invention, two TFTs 52a and 52b are located at two areas and are shared with a scan line 23 which is located between the two areas. The via holes 34a and 34b are disposed over the data lines 22a and 22b, respectively. The TFT 52a is connected to the data line 22a at a left side through the via hole 34a, while the TFT 52b is connected to the data line 22b at a right side through the via hole 34b. In other words, the data lines 22a and 22b are disposed at both sides of the pixel electrodes 362a, 362b. The second electrodes 362a and 362b of the TFTs 52a and 52b are electrically connected to the data lines 22a and 22b by means of the via holes 34a and 34b formed on top of the data lines 22a and 22b, and the drains (not shown) of the TFTs 52a and 52b are electrically connected to the scan line 23.

Figure 28:
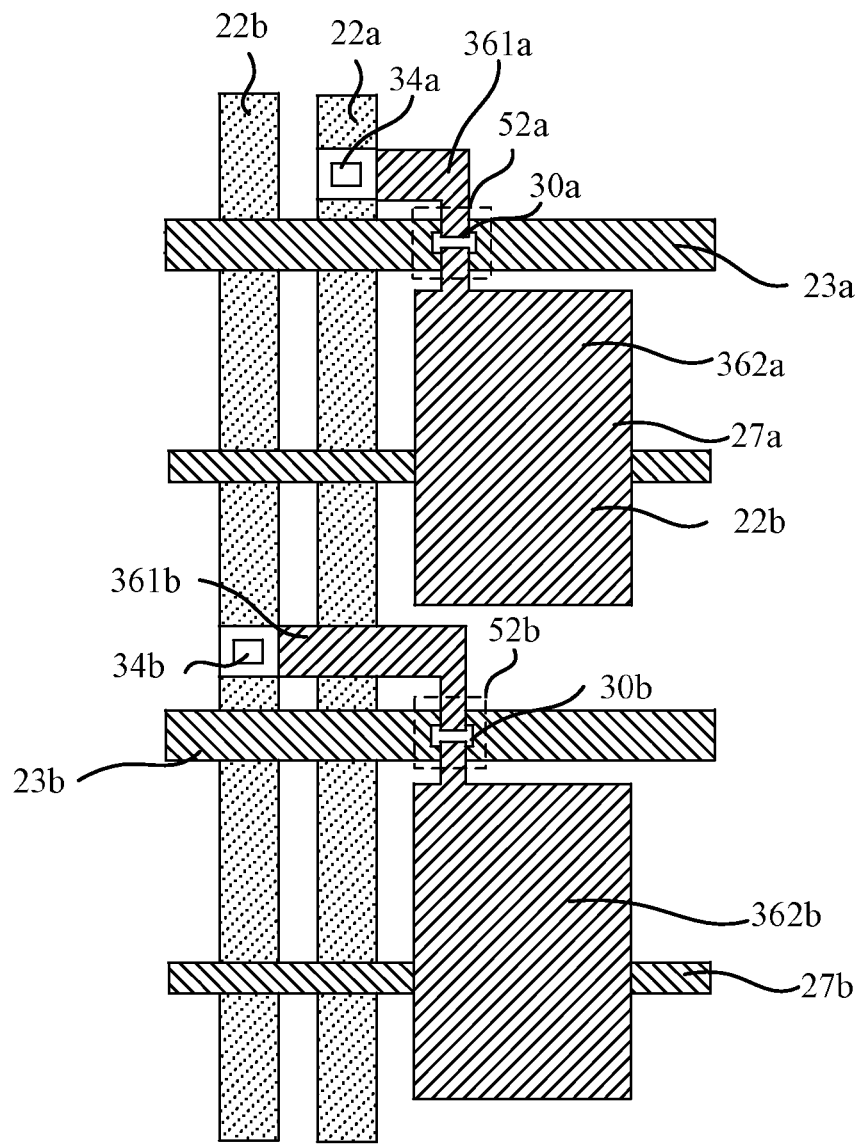
FIG. 28 shows a layout of the pixel units according to a third embodiment of the present invention.

Refer to FIG. 28 showing a layout of the pixel units according to a third embodiment of the present invention. In contrast to FIG. 26, the data lines 22a and 22b are disposed at the same side of the of the pixel electrodes 362a and 362b. The data lines 22a and 22b are disposed in parallel and in perpendicular to the scan lines 23a and 23b. The two via holes 34a and 34b are formed over the metal layer forming the data lines and are located at the same side of the pixel electrodes 362a and 362b.

Figure 29:
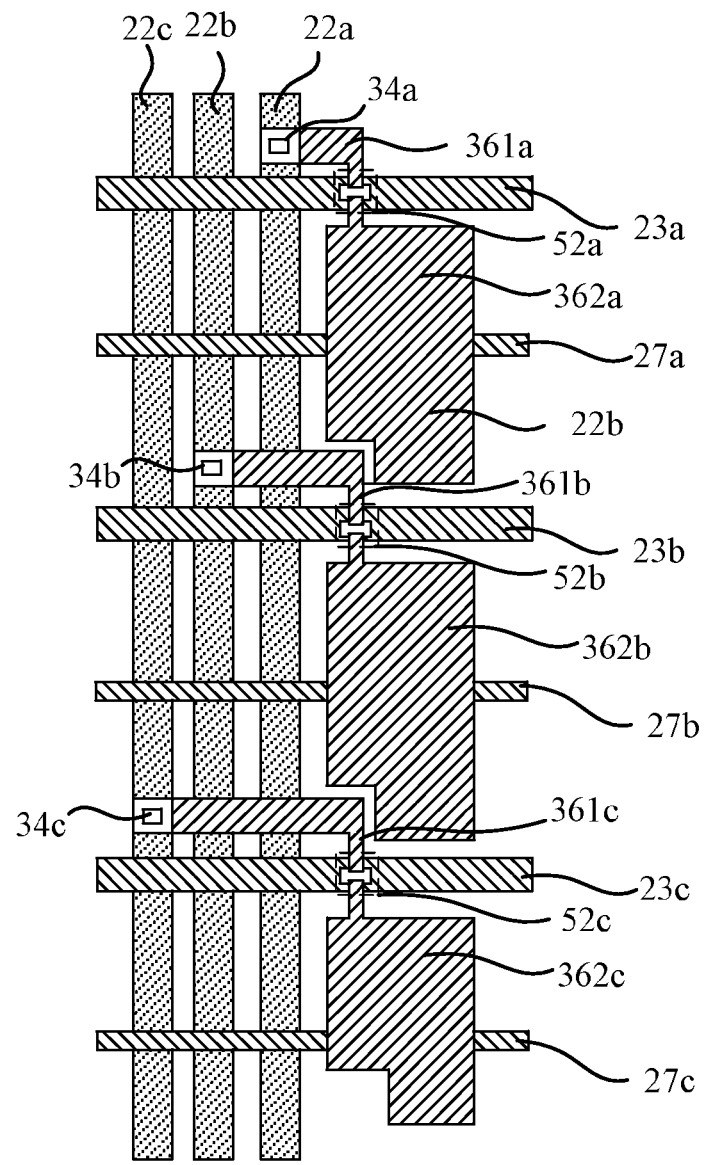
FIG. 29 shows a layout of the pixel units according to a fourth embodiment of the present invention.

Refer to FIG. 29 showing a layout of the pixel units according to a fourth embodiment of the present invention. In contrast to FIG. 28, each of the pixel electrodes 362a, 362b, and 362c is electrically and correspondingly connected to one of three data lines 22a, 22b, and 22c. In this embodiment, the data lines 22a, 22b, and 22c are located at the same side of the second electrodes 362a, 362b, and 362c. When the TFTs 52a, 52b, and 52c turn on, the second electrodes 362a, 362b, and 362c are electrically connected to the first electrodes 361a, 361b, and 361c through the via holes 34a, 34b, and 34c. Because the via holes 34a, 34b, and 34c are formed over the metal layer of the data lines 22a, 22b, and 22c, not only an aperture ratio and brightness of each of second electrodes 362a, 362b, and 362c functioning as pixel electrodes are not decreased due to the via holes 34a, 34b, and 34c, but also the frame rate of a display device raises.

In conclusion, in the disclosed embodiments of the present invention, whatever the number of data lines are, the connectivity follows the above mentioned approaches. Each pixel corresponds to an associated via hole does not increase the number of the via holes and not reduce the aperture ratio, and thus it is very proper to a design using more data lines and working in a high frequency. Moreover, the matrix circuitry of LCD of the present invention may be applied in a low temperature poly silicon LCD panel, an amorphous silicon LCD panel, or an organic light emitting diode display. Particularly, the matrix circuitry of LCD of the present invention is well applied in a display which not only increases a density of data lines to raise the frame rate but also maintains the aperture ratio and brightness.

Although the present invention has been explained by the embodiments shown in the drawings described above, it should be understood to the ordinary skilled person in the art that the invention is not limited to the embodiments, but rather various changes or modifications thereof are possible without departing from the spirit of the invention. Accordingly, the scope of the invention shall be determined only by the appended claims and their equivalents.

What is claimed is:

1. A method of forming a liquid crystal display panel, characterized in that the method comprises:
    providing a glass substrate;
    etching a first metal layer formed on the glass substrate to form a data line;
    depositing a first passivation layer and a second metal layer on the glass substrate and on the first metal layer in order, the first passivation layer being connected to the glass substrate and to the first metal layer;
    etching the second metal layer to form a gate of a thin film transistor and a bottom electrode of a storage capacitor;
    depositing an isolation layer and an active layer on the first passivation layer and on the second metal layer in order;
    etching the active layer for reserving the active layer above the control electrode, and the active layer being used as a channel of the thin film transistor;
    etching the first passivation layer and the isolation layer above the data line to form a via hole on top of the data line;
    depositing a transparent conducting layer on the isolation layer, the data line, and the active layer;
    disposing an ohmic contact layer between the active layer and the transparent conducting layer; and
    etching the transparent conducting layer to divide the transparent conducting layer into a first electrode and a second electrode, wherein the data line is electrically connected to the active layer through the first electrode on the via hole, and the active layer is electrically connected to the second electrode.

2. The method as claimed in claim 1, characterized in that:
    the isolation layer, the active layer, and an ohmic contact layer are deposited on the first passivation layer and on the second metal layer in order;
    the active layer and the ohmic contact layer are etched simultaneously for reserving the active layer and the ohmic contact layer on top of the control electrode, and the active layer serves as the channel of the thin film transistor;
    the first passivation layer and the isolation layer on the data line are etched for forming a via hole on top of the data line;
    the transparent conducting layer is deposited on the isolation layer, the data line, and the ohmic contact layer; and
    the transparent conducting layer and the ohmic contact layer are etched for dividing the transparent conducting layer into a first electrode and a second electrode and for dividing the ohmic contact layer into a first ohmic contact layer and a second ohmic contact layer, wherein the data line passes through the first electrode on the via hole, the first ohmic contact layer is disposed between the first electrode and the active layer, and the second ohmic contact layer is disposed between the second electrode and the active layer.

3. The method as claimed in claim 1, characterized in that the transparent conducting layer is made of indium tin oxide.

* * * * *